United States Patent
Farrell

[19]

[11] Patent Number: 6,043,113
[45] Date of Patent: Mar. 28, 2000

[54] METHOD OF FORMING SELF-ALIGNED THIN FILM TRANSISTOR

[75] Inventor: James F. Farrell, Etobicoke, Canada

[73] Assignee: 1294339 Ontario, Inc., Toronto, Canada

[21] Appl. No.: 09/000,153

[22] PCT Filed: Jul. 28, 1995

[86] PCT No.: PCT/CA95/00455

§ 371 Date: May 28, 1998

§ 102(e) Date: May 28, 1998

[87] PCT Pub. No.: WO97/05648

PCT Pub. Date: Feb. 13, 1997

[51] Int. Cl.[7] .................................................. H01L 21/00
[52] U.S. Cl. ..................... 438/158; 438/159; 438/303; 438/305
[58] Field of Search .................... 438/158, 159, 438/305, 303

[56] References Cited

U.S. PATENT DOCUMENTS

| | | | |
|---|---|---|---|
| 4,040,073 | 8/1977 | Luo | 357/21 |
| 5,157,000 | 10/1992 | Elkind et al. | 437/225 |

FOREIGN PATENT DOCUMENTS

| | | |
|---|---|---|
| 0 308 128 A1 | 3/1989 | European Pat. Off. |
| 61067268 | 4/1986 | Japan . |
| 62-140465 | 6/1987 | Japan . |
| 2 044 994 | 10/1980 | United Kingdom . |
| WO 94/13019 | 6/1994 | WIPO . |

OTHER PUBLICATIONS

G. D. Davis and N. E. Byer, "Surface stoichiometry changes induced by the hydrogenation of $Hg_{0.72}Cd_{0.28}Te$," *Journal of Vacuum Science & Technology,* A3(1), (Jan.Feb. 1985), pp. 203–205.

R. R. Daniels, et al., "Changes in the local chemical composition during the $Hg_{1-x}Cd_xTe$–Al interface formation," *Appl. Phys. Letts.,* 42(1), (Jan. 1983), pp. 50–52.

D. Ballutaud, et al., "Reactivity of III–V and II–VI semiconductors toward hydrogen: surface modification and evolution in air," *Applied Surface Science,* vol. 84, No. 2 (Feb. 1995), pp. 187–192.

Applied Physics Letters, vol. 62, No. 18, May 3, 1993, New York, YS, pp. 2254–2255, XP000565185 C.Debienne–Chouvy et al.

*Primary Examiner*—John F. Niebling
*Assistant Examiner*—Christopher Lattin
*Attorney, Agent, or Firm*—Fay, Sharpe, Fagan, Minnich & McKee, LLP

[57] ABSTRACT

During the formation of a self-aligned thin film transistor (50), the semiconductor material channel layer (58) on the gate insulating layer (56) has a passivation shield ($P_S$) applied to it aligned with the gate electrode (54). The channel layer is then exposed to a reagent selected to yield a chemical reaction with the portions of the channel layer (58) not covered by the passivation shield ($P_S$) causing removal of a component of the semiconductor material thereby to change the electrical properties of those portions of the channel layer. In this manner, doped source and drain regions (60, 62) can be formed on opposite sides of the channel having edges that extend to the edges of the gate electrode avoiding any overlap therebetween and reducing the parasitic capacitance of the thin film transistor (50).

14 Claims, 5 Drawing Sheets

METHOD OF FORMING SELF-ALIGNED THIN FILM TRANSISTOR

TECHNICAL FIELD

The present invention relates to semiconductor fabrication methods and in particular to a method of doping a compound semiconductor material. More specifically, the present invention relates to a method of forming a self-aligned thin film transistor (TFT).

BACKGROUND ART

Self-aligned field effect transistors (FETS) are known in the art. During the formation of transistors of this nature, ion implantation has been used to form the heavily doped source and drain regions of the transistor so that the edges of the source and drain regions line up with the edges of the gate electrode. This doping of the source and drain regions is of course necessary since these regions are unmodulated by the gate electrode. Since there is no overlap of the source and drain regions with the gate electrode, the parasitic capacitance of the transistor is greatly reduced as compared to conventional transistors having gate electrodes and source and drain regions that overlap.

Parasitic capacitance affects the switching speed of a transistor. Therefore, in environments requiring high speed switching, such as in driver circuits for active matrix liquid crystal displays (AMLCDs), it is desired to minimize the parasitic capacitance of transistors to increase their switching speed. Although ion implantation methodology has allowed self-aligned transistors which reduce parasitic capacitance to be fabricated, ion implantation is a high energy process. Accordingly, alternative methods of doping semiconductor material and fabricating self-aligned transistors which reduce energy requirements are desired.

Therefore, it is an object of the present invention to provide a novel method of doping compound semiconductor material and a novel method of forming a self-aligned thin film transistor.

DISCLOSURE OF THE INVENTION

According to one aspect of the present invention there is provided a method of doping a compound semiconductor material comprising the step of:

exposing the compound semiconductor material to a reagent selected to yield a chemical reaction with the semiconductor material causing removal of a component of said semiconductor material thereby to change its electrical properties and dope said semiconductor material.

According to another aspect of the present invention there is provided a method of forming a self-aligned thin film transistor comprising the steps of:

depositing a gate electrode on a surface of a glass substrate and covering said surface and gate electrode with a gate insulating layer;

depositing a channel layer formed of compound semiconductor material on said gate insulating layer, said channel layer being positioned over and extending beyond said gate electrode;

depositing a shield on a portion of said channel layer aligned with and overlying said gate electrode;

subjecting the structure to a reagent selected to react with said semiconductor material causing removal of a component thereof, said reagent reacting with the portions of said channel layer not covered by said shield to form doped source and drain regions extending to the edges of said gate electrode and positioned on opposite sides of a channel; and forming source and drain electrodes in contact with said respective source and drain regions.

In yet another aspect of the present invention there is provided in a self-aligned thin film transistor fabrication method wherein a gate electrode is deposited on a substrate, said substrate and gate electrode are covered by a gate insulating layer, a channel and doped source and drain regions on opposite sides of said channel are deposited on said gate insulting layer and source and drain electrodes are formed and contact the respective source and drain region, the improvement comprising:

depositing a channel layer formed of a compound semiconductor material on said gate insulating layer;

shielding a portion of said channel layer overlying and aligned with said gate electrode; and doping portions of said channel layer not shielded by exposing the portions to a reagent selected to yield a chemical reaction with said compound semiconductor material causing removal of a component of said semiconductor material thereby to change its electrical properties and define said doped source and drain regions.

In still yet another aspect of the present invention there is provided a method of forming a self-aligned thin film transistor, wherein a gate insulating layer covers a gate electrode and a surface of a glass substrate, said method comprising the steps of:

depositing a channel layer formed of compound semiconductor material on said gate insulating layer, said channel layer being positioned over and extending beyond said gate electrode;

forming a shield over a portion of said channel layer aligned with and overlying said gate electrode;

subjecting the structure to a reagent selected to react with said semiconductor material causing removal of a component thereof, said reagent reacting with the portions of said channel layer not covered by said shield to form doped source and drain regions extending to the edges of said gate electrode and positioned on opposite sides of a channel; and placing source and drain electrodes in contact with said respective source and drain regions.

Preferably, the compound semiconductor material is formed of one of CdSe, CdTe, CdS, InP and GaP. It is also preferred that the reagent is in the form of one of a gas, plasma or liquid chemical reagent.

The present invention provides advantages in that a low temperature and low energy process is used to fabricate a self-aligned transistor which makes use of the fact that most compound semiconductor materials will react with a reagent causing removal of one of the components of the semiconductor material and thereby causing the electrical properties of the semiconductor material to change.

BRIEF DESCRIPTION OF THE DRAWINGS

Embodiments of the present invention will now be described more fully with reference to the accompanying drawings in which.

BEST MODES FOR CARRYING OUT THE INVENTION

Figure 1A:
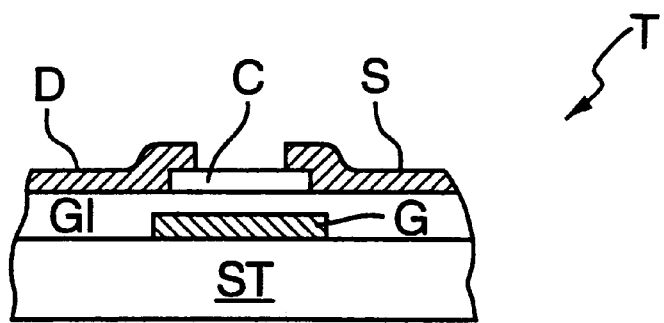
FIGS. 1a, 1b and 1c are cross-sectional views of various prior art thin film transistors having inverted staggered structures.
Figure 1B:
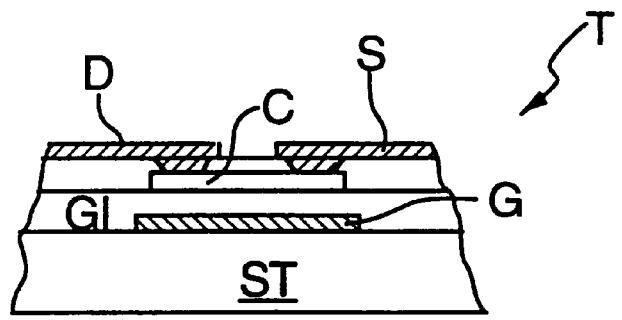
Figure 1C:
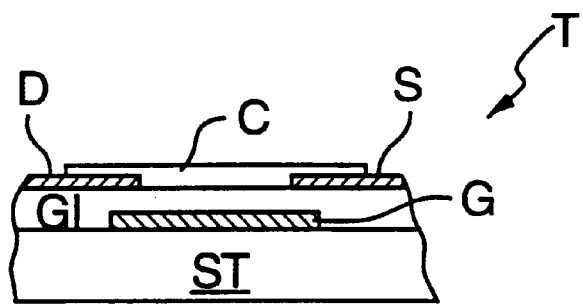

FIGS. 1a to 1c show a number of prior art thin film transistors T, each having an inverted staggered structure. Each transistor includes a substrate ST, a gate insulating layer GI and a semiconductor material channel C defining the source and drain regions of the transistor. Source and drain electrodes S and D respectively are located on the gate insulating layer adjacent the source and drain regions. A gate electrode G is located between the substrate and the gate insulating layer. In each of these transistors T, there is an overlap between the source and drain electrodes and the gate electrode. It is this overlap which is responsible for parasitic capacitance.

Figure 2:
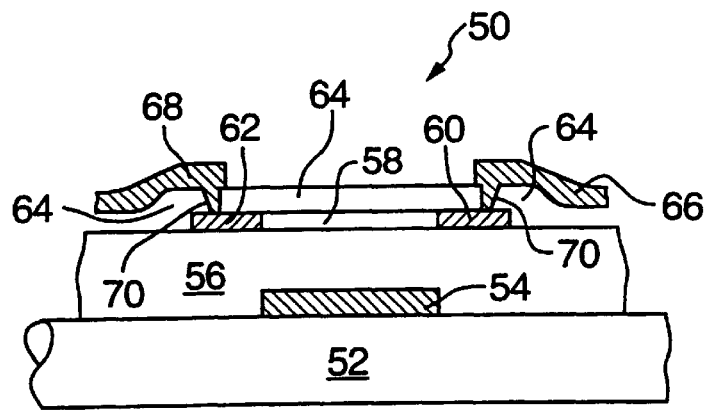
FIG. 2 is a cross-sectional view of a self-aligned thin film transistor having an inverted staggered structure and formed in accordance with the present method.

FIG. 2 shows a self-aligned thin film transistor fabricated in accordance with the present method and is indicated generally by reference numeral 50. As can be seen, the transistor 50 includes a glass substrate 52 on which a Cr gate electrode 54 is located. A gate insulating layer 56 formed of $SiO_2$ overlies the gate electrode 54 and one surface of the glass substrate 52. A compound polycrystalline semiconductor material channel 58 formed of Cadmium Selenide (CdSe) is on the gate insulating layer 56 above the gate electrode. Doped source and drain regions 60 and 62 respectively formed of semiconductor material are on opposite sides of the channel 58. A passivation layer 64 in the form of a positive photoresist covers the source and drain regions 60 and 62, the channel 58 and the gate insulating layer 56. Source and drain electrodes 66 and 68 are located on the passivation layer 64 and contact a respective one of the source and drain regions 60 and 62 through vias 70 formed in the passivation layer.

The present method of forming the transistor 50 will now be described with particular reference to FIGS. 3a to 3f. During the fabrication process, after the gate electrode 54 and gate insulating layer 56 have been deposited on the glass substrate 52 (see FIG. 3a), a channel layer 58 is deposited on the gate insulating layer 56 (see FIG. 3b). As can be seen, the channel layer overlies and extends beyond the gate electrode 54. A passivation shield $P_S$ in the form of a positive photoresist is then deposited over the channel layer 58 and the gate insulating layer 56.

Figure 3A:
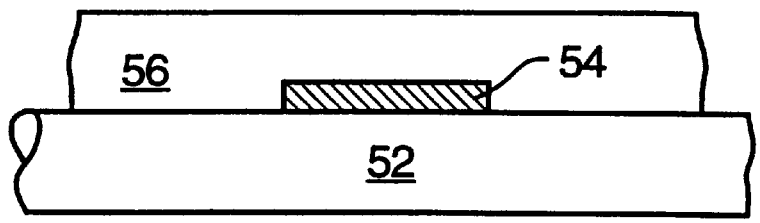
FIGS. 3a to 3f show fabrication steps performed during the formation of the thin film transistor of FIG. 2.
Figure 3B:
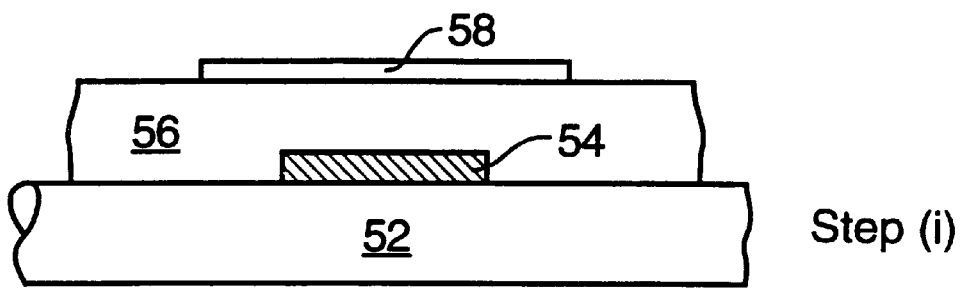
Figure 3C:
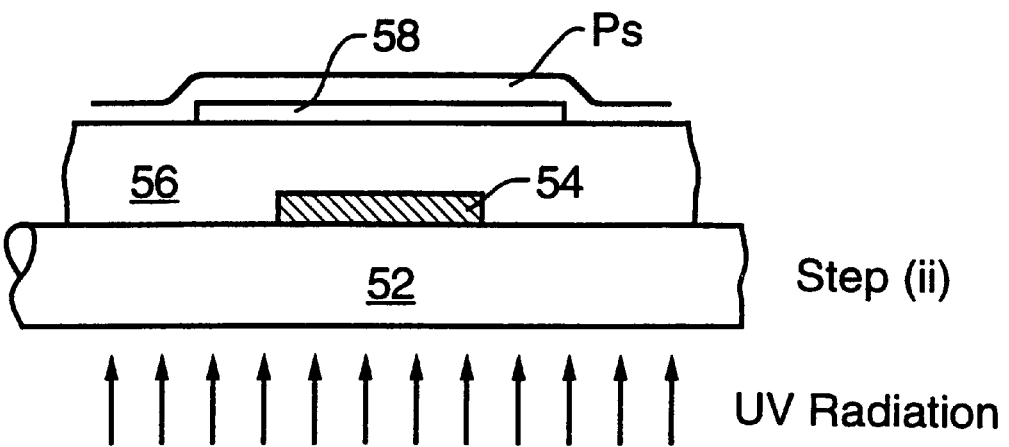

The structure is then exposed to UV radiation from the rear side (see FIG. 3c). The glass substrate 52, gate insulating layer 56 and channel layer 58 are transparent; however, the gate electrode 54 is opaque. Because of this, only the portion of the passivation shield $P_S$ overlying and aligned with the gate electrode 54 polymerizes. After this, the portion of the passivation shield $P_S$ that does not polymerize is removed.

Figure 3D:
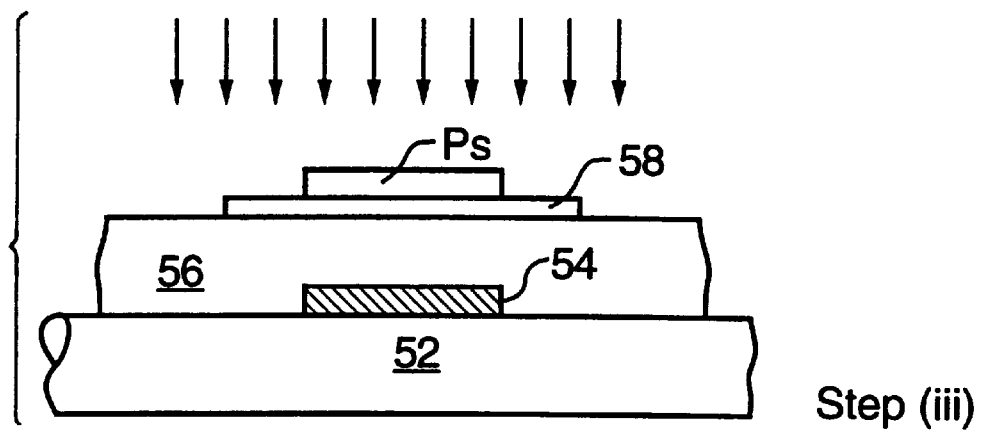

Following this, the structure is exposed to a reagent selected to react with the semiconductor material forming the channel layer 58 which will cause removal of a component of the semiconductor material and thereby change its electrical properties in the desired manner (see FIG. 3d). The passivation shield $P_S$ prevents the portion of the channel layer 58 located directly below it from being exposed to the reagent. Therefore, the electrical properties of the portion of the channel layer 58 aligned with the gate electrode 54 remain unchanged. However, the portions of the channel layer 58 that are not covered by the passivation shield $P_S$ react with the reagent. In this example, since the channel layer 58 is formed of CdSe, the CdSe layer is exposed to a Hydrogen (H) plasma reagent yielding a chemical reaction which selectively removes Selenium (Se) causing Selenium vacancies to be present in the polycrystalline semiconductor material (ie. $CdSe+H \rightarrow Cd+H_2Se$). The Selenium vacancies result in the semiconductor material becoming highly $n^+$ type (i.e. doped).

During this stage of the process, it is important to subject the semiconductor material to the reagent so that the semiconductor material becomes heavily doped. The parameters which affect the reaction between the reagent and the semiconductor material are exposure time, temperature, power and reagent concentration. By adjusting the reagent concentration, the exposure time can be set to give an adequate exposure time window.

Prior to performing this stage, calibration tests are performed on semiconductor material to determine the values of the parameters necessary to achieve the desired doping concentration while maintaining the desired exposure time window. Once the values of the parameters have been determined, they are used when subjecting the semiconductor material channel layer to the reagent.

Figure 3E:
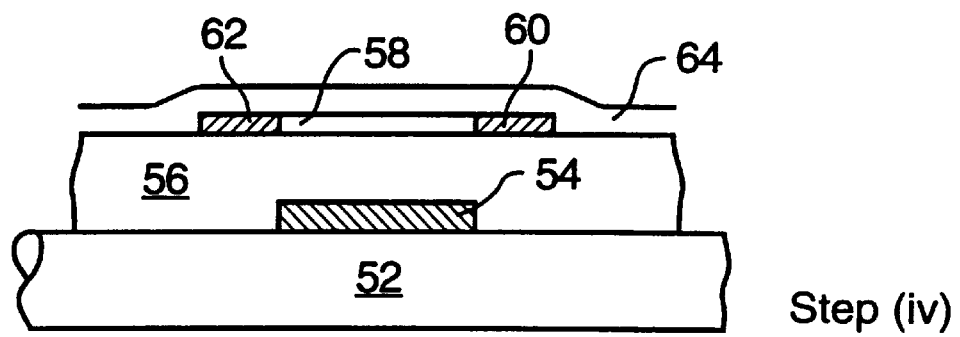
Figure 3F:
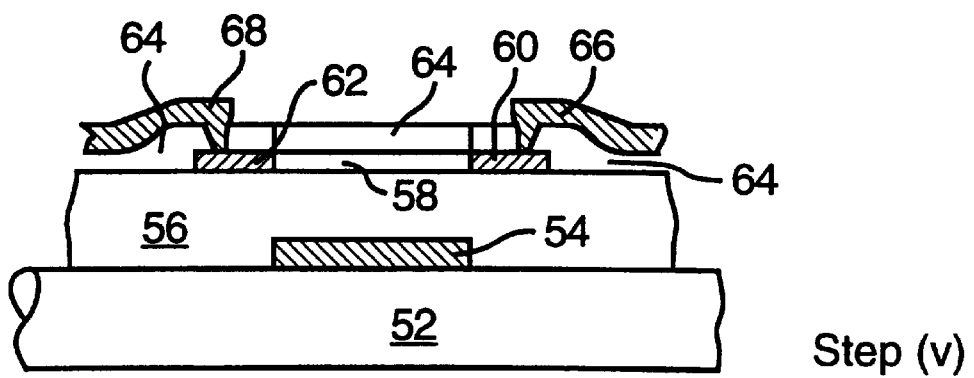

Since the passivation shield $P_S$ is aligned with the gate electrode 54, the portions of the channel layer 58 on opposite sides of the passivation shield that undergo changes in electrical properties (i.e. become heavily doped), define the source and drain regions of the transistor 50 and have edges that line up with the edges of the gate electrode (FIG. 3e). In this way, there is no overlap of the source and drain regions with the gate electrode thereby reducing the parasitic capacitance of the transistor.

Once the source and drain regions have been formed, the passivation shield $P_S$ is removed and the structure is covered with a passivation layer 64 (also see FIG. 3e). Contact vias 70 are formed in the passivation layer 64 above the source and drain regions 60 and 62 respectively and the source and drain electrodes 66 and 68 respectively are then formed to complete the thin film transistor.

Figure 4:
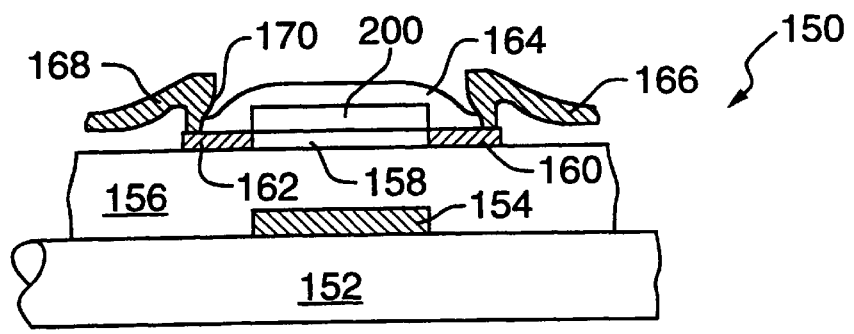
FIG. 4 is a cross-sectional view of an alternative embodiment of a self-aligned thin film transistor formed in accordance with the present method.

Referring now to FIG. 4, a self-aligned film transistor fabricated using an alternative embodiment of the present method is shown. In this embodiment, like reference numerals will be used to indicate like components with a "100"

added for clarity. In this embodiment, the transistor 150 is very similar to that shown in FIG. 2 and includes a glass substrate 152, a gate electrode 154, a gate insulating layer 156 and a compound semiconductor material channel 158. Doped source and drain regions 160 and 162 respectively formed of semiconductor material are on opposite sides of the channel 158. Overlying the channel 158 and aligned with the gate electrode 154 is a shield 200 formed of $SiO_2$. A passivation layer 164 covers the gate insulating layer 156, source and drain regions 160 and 162 and the passivation shield 200. Source and drain electrodes 166 and 168 contact a respective one of the source and drain regions 160 and 162 through vias 170 formed in the passivation layer 164.

Figure 5A:
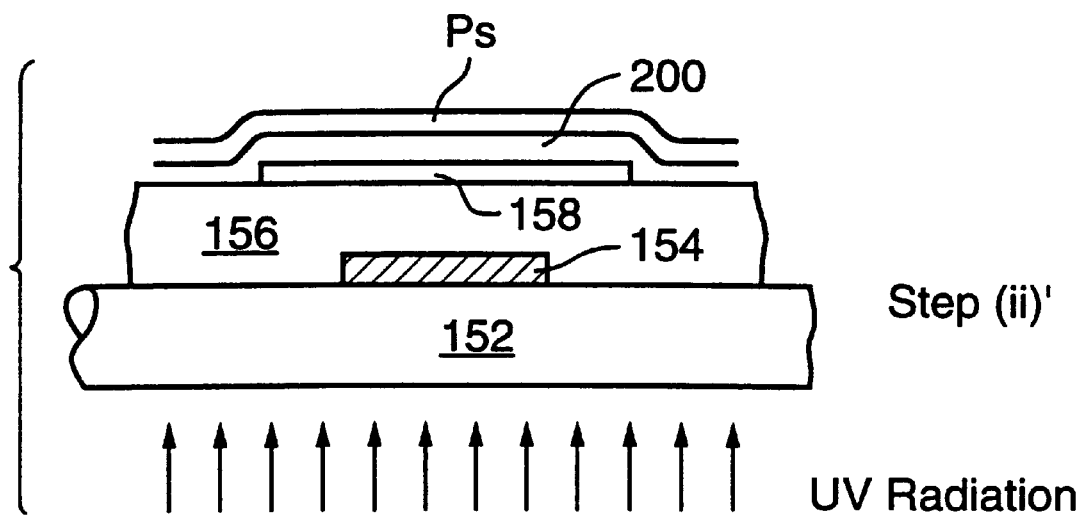
FIGS. 5a and 5b show fabrication steps performed during the formation of the thin film transistor of FIG. 4.
Figure 5B:
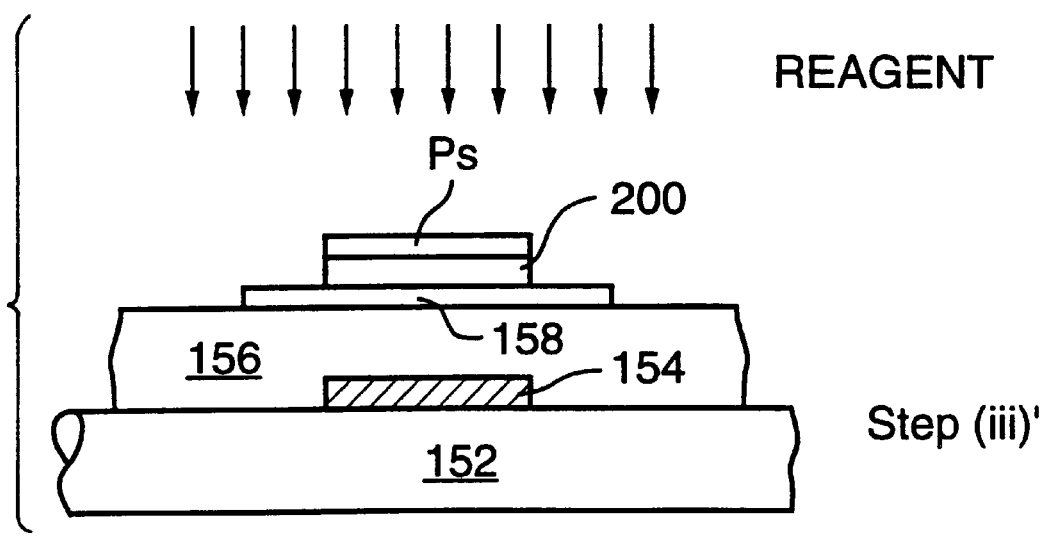

During formation of transistor 150, after the gate electrode 154, gate insulating layer 156 and channel layer have been formed on the substrate 152 and prior to exposing the structure to UV radiation, the structure is covered with a layer 200 of $SiO_2$ and then with a passivation shield $P_S$ in the form of a positive photoresist. The structure is then exposed to UV radiation causing the photoresist aligned with and overlying the gate electrode to polymerize (see FIG. 5a). Once this has been done, the portion of the passivation shield $P_S$ that does not polymerize is removed and the exposed $SiO_2$ layer is etched from the structure. Following this, the structure is treated in the manner described previously by exposing the structure to a suitable reagent (see FIG. 5b) and completing steps (iv) and (v) shown in FIGS. 3e and 3f.

Figure 6:
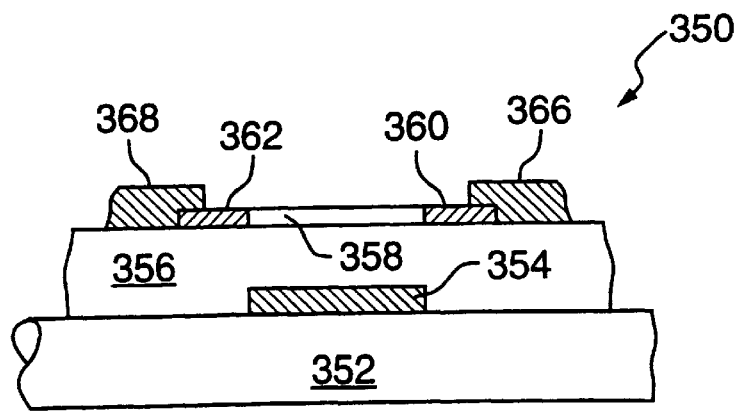
FIG. 6 is a cross-sectional view of yet another embodiment of a self-aligned thin film transistor formed in accordance with the present method.

If desired during the fabrication process, step (iv) illustrated in FIG. 3e may be omitted so that once the structure has been subjected to the reagent to remove selectively a component of the semiconductor material to form the doped source and drain regions and the passivation shield has been removed from the structure, the source and drain electrodes can be formed directly on the respective source and drain regions and the gate insulating layer. FIG. 6 shows a self-aligned thin film transistor formed in this manner. As can be seen, transistor 350 is very similar to those previously described except that the passivation layer has been removed avoiding the need to form contact vias.

Although the gate electrode has been described as being formed of Chromium, it should be realized that any refractory metal or combination of refractory and high conductivity metals are suitable. The gate insulating layer may also be formed of materials other than $SiO_2$ such as for example $Si_3N_4$ or any other dielectric material suitable for forming an isolation layer in a field effect transistor.

As one of skill in the art will appreciate, the channel layer must be formed of a compound semiconductor material which reacts with a reagent to yield a chemical reaction which selectively removes a component of the semiconductor material. Although the preferred embodiment describes the semiconductor material as being CdSe, other compound semiconductor materials can be used such as for example CdS, CdTe, InP and GaP. The reagent will of course be selected based on the type of compound semiconductor material forming the channel layer and may be a gas, plasma or liquid chemical reagent.

The preferred embodiments of the present invention have been described during formation of self-aligned thin film transistors. However, those of skill in the art will appreciate that the present method of doping compound semiconductor material can be used during the formation of virtually any semiconductor device.

When the thin film transistors are for use in an active matrix liquid crystal display or a flat panel detector for radiation imaging, an array of the transistors is formed simultaneously on a common substrate. Those of skill in the art will appreciate that the various layers forming the array of transistors are deposited on the substrate and etched as required.

Those of skill in the art will also appreciate that various modifications may be made to the present invention without departing from its scope as defined by the appended claims.

What is claimed is:

1. A method of forming a self-aligned thin film transistor comprising the steps of:

depositing a gate electrode on a surface of a glass substrate and covering said surface and gate electrode with a gate insulating layer;

depositing a channel layer formed of compound semiconductor material on said gate insulating layer, said channel layer being positioned over and extending beyond said gate electrode;

depositing a shield on a portion of said channel layer aligned with and overlying said gate electrode;

subjecting the structure to a reagent selected to react with said semiconductor material causing removal of a component thereof, said reagent reacting with the portions of said channel layer not covered by said shield to form doped source and drain regions extending to the edges of said gate electrode and positioned on opposite sides of a channel; and forming source and drain electrodes in contact with said respective source and drain regions.

2. The method of claim 1 wherein said shield is formed on said channel layer using positive photoresist.

3. The method of claim 2 wherein prior to forming said source and drain electrodes, said shield is removed and a passivation layer is placed over said drain and source regions, said channel and said gate insulating layer, said drain and source electrodes contacting said respective source and drain regions through vias formed in said passivation layer.

4. The method of claim 1 wherein a layer of $SiO_2$ is formed on said channel layer interposed between said channel layer and said shield.

5. The method of claim 1 wherein said semiconductor material is formed of one of CdSe, CdTe, CdS, InP and GaP.

6. The method of claim 1 wherein said reagent is in the form of one of a gas, plasma and liquid chemical reagent.

7. A self-aligned thin film transistor fabrication method wherein a gate electrode is deposited on a substrate, said substrate and gate electrode are covered by a gate insulating layer, a channel and doped source and drain regions on opposite sides of said channel are deposited on said gate insulating layer and source and drain electrodes are formed and contact the respective source and drain region, the improvement comprising:

depositing a channel layer formed of a compound semiconductor material on said gate insulating layer;

shielding a portion of said channel layer overlying and aligned with said gate electrode; and doping portions of said channel layer not shielded by exposing the portions to a reagent selected to yield a chemical reaction with said compound semiconductor material causing removal of a component of said semiconductor material thereby to change its electrical properties and define said doped source and drain regions.

8. The method of claim 7 wherein said semiconductor material is formed of CdSe and said reagent is in the form of a hydrogen plasma.

9. The method of claim 7 wherein said semiconductor material is formed of one of CdSe, CdTe, CdS, InP and GaP.

10. The method of claim 7 wherein said reagent is in the form of one of a gas, plasma and liquid chemical reagent.

11. In a method of forming a self-aligned thin film transistor, wherein a gate insulating layer covers a gate electrode and a surface of a glass substrate, said method comprising the steps of:

depositing a channel layer formed of compound semiconductor material on said gate insulating layer, said channel layer being positioned over and extending beyond said gate electrode;

forming a shield over a portion of the channel layer aligned with and overlying said gate electrode;

subjecting the structure to a reagent selected to react with said semiconductor material causing removal of a component thereof, said reagent reacting with the portions of said channel layer not covered by said shield to form doped source and drain regions extending to the edges of said gate electrode and positioned on opposite sides of a channel; and forming source and drain electrodes in contact with said respective source and drain regions.

12. The method of claim 11 wherein said semiconductor material is formed of CdSe and said reagent is in the form of a hydrogen plasma.

13. The method of claim 11 wherein said semiconductor material is formed of one of CdSe, CdTe, CdS, InP and GaP.

14. The method of claim 11 wherein said reagent is in the form of one of a gas, plasma and liquid chemical reagent.

* * * * *